US008350565B2

(12) United States Patent
Honkura et al.

(10) Patent No.: US 8,350,565 B2
(45) Date of Patent: Jan. 8, 2013

(54) ULTRA-SENSITIVE MAGNETOIMPEDANCE SENSOR

(75) Inventors: Yoshinobu Honkura, Aichi (JP); Michiharu Yamamoto, Aichi (JP); Norihiko Hamada, Aichi (JP); Akihiro Shimode, Aichi (JP)

(73) Assignee: Aichi Steel Corporation, Aichi (JP)

( * ) Notice: Subject to any disclaimer, the term of this patent is extended or adjusted under 35 U.S.C. 154(b) by 0 days.

(21) Appl. No.: 13/138,895

(22) PCT Filed: Apr. 23, 2010

(86) PCT No.: PCT/JP2010/057263
§ 371 (c)(1),
(2), (4) Date: Oct. 19, 2011

(87) PCT Pub. No.: WO2010/123109

PCT Pub. Date: Oct. 28, 2010

(65) Prior Publication Data
US 2012/0038358 A1    Feb. 16, 2012

(30) Foreign Application Priority Data

Apr. 23, 2009   (JP) ................................ 2009-104903

(51) Int. Cl.
*G01R 33/02*   (2006.01)
(52) U.S. Cl. ......... 324/252; 324/200; 324/253; 324/255
(58) Field of Classification Search ........................ None
See application file for complete search history.

(56) References Cited

U.S. PATENT DOCUMENTS
7,224,161 B2 * 5/2007 Honkura et al. ............. 324/249
8,063,634 B2 * 11/2011 Sauber et al. ................. 324/252

FOREIGN PATENT DOCUMENTS
JP    2002-286821 A    10/2002
JP    2006-300906 A    11/2006

OTHER PUBLICATIONS

A. Antonov et al., "*The features of GMI effect in amorphous wires at microwaves*", Physica A, vol. 241, pp. 420-424, Elsevier Science B.V., (Jan. 1997). Kaneo Mohri, "*Jiki Sensa Rikougaku*", p. 13, Corona Publishing Co., Ltd., (Mar. 1998).
L.V. Panina et al., "*Magnetoimpedance in amorphous wire and multifunctional applications: from sensors to tunable artificial microwave materials*", Journal of Magnetism and Magnetic Materials, 272-276 (2004) 1452-1459, pp. 28-35, Elsevier B. V., (2003).
International Search Report mailed on Jul. 20, 2010.

* cited by examiner

*Primary Examiner* — Jermele M Hollington
*Assistant Examiner* — Trung Nguyen
(74) *Attorney, Agent, or Firm* — Rader, Fishman & Grauer PLLC

(57) ABSTRACT

Provided is a magnetoimpedance (MI) sensor having a high magnetic sensor sensitivity and a wide measurement range. The MI sensor comprises an MI element, an electric current supply unit and a signal processing circuit. The MI element comprises a magnetosensitive wire formed of an amorphous soft magnetic alloy having zero magnetostriction, and a detection coil provided around the magnetosensitive wire with an electric insulator disposed therebetween, thereby detecting voltage generated at the detection coil and corresponding to an external magnetic field upon application of a high frequency electric current to the magnetosensitive wire. The electric current supply unit supplies the high frequency electric current to the MI element. The signal processing circuit processes an output signal from the detection coil. In this MI sensor, the magnetosensitive wire has at least a surface layer in which spins are aligned in a circumferential direction of the wire, and the high frequency electric current has a frequency in the range of 0.3 to 1.0 GHz inclusive.

1 Claim, 5 Drawing Sheets

(a)

(b)

(a) SPECIMEN 1

(b) SPECIMEN 2

(a) SPECIMEN 1

(b) SPECIMEN 2

ULTRA-SENSITIVE MAGNETOIMPEDANCE SENSOR

TECHNICAL FIELD

The present invention relates to a magnetoimpedance sensor (hereinafter abbreviated as an MI sensor) having excellent magnetic sensitivity.

BACKGROUND ART

When a high frequency pulse current or sinusoidal current is applied to an amorphous CoFeSiB based alloy wire, impedance changes with a magnetic field due to skin effect. This is a known phenomenon called magnetoimpedance effect (hereinafter abbreviated as MI effect). Some magnetoimpedance elements (hereinafter abbreviated as MI elements) directly detect this change by measuring impedance of the amorphous wire between ends thereof, and other MI elements detect this change by way of a detection coil wound around the amorphous wire. High-sensitive magnetic sensors using these MI elements are MI sensors.

These MI sensors are used in cellular phones and the like these days, but have a problem in that when sensor sensitivity is enhanced, measurement range is decreased. Conventionally control of sensitivity and measurement range has been carried out by two methods: a method using a demagnetizing field and a method controlling magnetic characteristics of a magnetosensitive wire. The method using a demagnetizing field is to reduce a longitudinal demagnetizing field by increasing length of a magnetosensitive wire in order to enhance sensitivity. However, because of the reduction in the demagnetizing field, measurement range is narrowed. Conversely, if length of a magnetosensitive wire is decreased, the longitudinal demagnetizing field is increased and measurement range is widened, but sensitivity is decreased. On the other hand, the method controlling magnetic characteristics of a magnetosensitive wire is to enhance sensor sensitivity by increasing magnetic permeability of the magnetosensitive wire in a longitudinal direction. However, due to this increase, measurement range of the magnetosensitive wire comprising a soft magnetic material which exhibits a magnetic saturation phenomenon is inevitably decreased. Conversely, if magnetic permeability in the longitudinal direction is decreased, measurement range is widened but naturally sensitivity is decreased. That is to say, sensitivity enhancement and measurement range increase are conflicting phenomena and are not compatible.

For example, as described in the official gazette of Japanese patent No. 3,693,119, when a pulse current having a frequency of 0.2 GHz, which was calculated by converting pulse rise time or fall time to frequency, was applied to a magnetosensitive wire having a wire diameter of 30 μm and a rather long length of 1.5 mm, a conventional MI sensor using this wire exhibited a sensitivity of 35 mV/G and a measurement range of 0.9 kA/m. This is a case of attaining high sensitivity using a demagnetizing field. On the other hand, when such a current was applied to a magnetosensitive wire having a wire diameter of 30 μm and a rather short length of 0.6 mm, a conventional MI sensor using this wire exhibited a sensitivity of 2 mV/G and a measurement range of 3.6 kA/m. This is a case of attaining wide measurement range using a demagnetizing field. Sensitivity and measurement range of a MI sensor have such a conflicting relationship as mentioned above, and therefore, it is difficult to improve the both simultaneously and there is a limit in practical use.

Here, an attempt to enhance sensitivity has been made by further increasing frequency of a high frequency electric current. L. V. Panina et al., Journal of Magnetism and Magnetic Materials, volumes 272-276 (2004), pp. 1452-1459 discloses measurement results of impedance of an amorphous wire between ends thereof when a sinusoidal current of 0.5 to 2.2 GHz was applied to the amorphous wire. According to the results, sensitivity was improved by increasing frequency but the problem is that measurement range was as remarkably low as 0.0125 A/m (1Oe) and was not widened by increasing frequency. Simultaneous improvement of both sensitivity and measurement range was not achieved.

CITATION LIST

Patent Literature

[PTL 1] Japanese Patent No. 3,693,119

Non-Patent Literature

[NPL 1] L. V. Panina et al., Journal of Magnetism and Magnetic Materials, volumes 272-276 (2004), pp. 1452-1459

SUMMARY OF INVENTION

Problems to be Solved by the Invention

Under these circumstances, the present invention provides an MI sensor having a compact size, a high magnetic sensor sensitivity and a wide measurement range.

Means for Solving the Problems

The present inventors have made various researches on frequency and waveform of a high frequency electric current, detection methods, magnetosensitive wires and so on. As a result of these, the present inventors have conceived an idea that a high sensitivity and a wide measurement range may be obtained by having spin rotation make uniform, simultaneous, and sharp precession movement with electric current application by applying a high frequency electric current which has a higher frequency than conventional ones to an amorphous magnetosensitive wire in a method using a detection coil for directly detecting a spin rotation phenomenon. Then, the present inventors have completed the present invention, specifically speaking, by supplying a magnetosensitive wire with an electric current having a predetermined frequency which is higher than conventional ones and employing a method using a detection coil for detecting an output.

Specifically, a magnetoimpedance sensor recited in claim 1 of the present invention comprises a magnetoimpedance element including a magnetosensitive wire formed of an amorphous soft magnetic alloy having zero magnetostriction, and a detection coil provided around the magnetosensitive wire with an electric insulator disposed therebetween, thereby detecting voltage generated at the detection coil and corresponding to an external magnetic field upon application of a high frequency electric current to the magnetosensitive wire; an electric current supply unit for supplying a high frequency electric current to the magnetoimpedance element; and a signal processing circuit for signal processing an output from the detection coil, wherein the magnetosensitive wire has at least a surface layer in which spins are aligned in a circumferential direction of the wire, and the high frequency electric current has a frequency in the range of 0.3 to 1.0 GHz inclusive.

The reason why an excellent effect is obtained by employing constitution of the present invention has not been clarified, but the following hypothesis is proposed based on the obtained results.

First, consideration will be given to the reason why an excellent sensitivity is obtained when a high frequency electric current has a frequency in the range of 0.3 to 1.0 GHz inclusive.

It is known that voltage detected by a detection coil is proportional to $d\phi/dt$. First, when a high frequency electric current is applied to a magnetosensitive wire, a magnetic field is formed in a circumferential direction of the magnetosensitive wire. Spins in the wire rotate from the direction of an external magnetic field to the direction of a circumferential magnetic field formed by the electric current. As time change $dH\phi/dt$ of the circumferential magnetic field ($H\phi$) formed by the electric current is greater, that is to say, as an electric current having a higher frequency is applied, the spin rotational velocity in the wire is greater. Since this spin rotational velocity corresponds to $d\phi/dt$, it is supposed that voltage detected by the detection coil is greater and sensitivity is higher.

However, in general, as an electric current has a higher frequency, the electric current flows within a smaller skin depth. Therefore, the absolute amount of spins which react to a circumferential magnetic field formed by a skin current flowing through the skin, that is to say, $\phi$ is decreased, and voltage $d\phi/dt$ detected by the detection coil is decreased. Because of these actions, it is difficult to predict what kind of behavior sensitivity takes with respect to a change in frequency.

It turned out as mentioned later that when frequency is increased from 0 to 0.5 GHz, sensitivity is enhanced. Based on this fact, it is assumed that internal stress acts within a magnetosensitive wire in the following manner.

Generally, internal stress within a magnetosensitive wire is large in a surface layer portion and small in an internal portion with respect to a circumferential direction. Precession movement of spins is caused within skin depth which is proportional to frequency of a high frequency current applied. When a high frequency current has a frequency below certain level, since skin depth is great and internal stress is not uniformly distributed within the skin depth, respective spins make movements in various manners within the skin depth. If respective spins make precession movements in various manners, sensor sensitivity is supposed to be decreased. Conversely, when a high frequency current has a frequency of 0.3 GHz or more, since skin depth is decreased and ununiformity of internal stress distribution is also decreased, it is supposed that a phenomenon that spin rotation makes uniform, simultaneous and sharp precession movement with application of the current is exhibited.

Although the mechanism is not clear, why sensitivity is enhanced with an increase in frequency can be explained as one inference as above. In reality, however, when frequency exceeds 0.5 GHz, sensitivity reaches a peak and then decreases thereafter. Presence of this peak is unexpected and it is attributed to waving of spins caused by spin resonance phenomenon. It is supposed that simultaneous spinning is disturbed by waving of the whole spins and accordingly advantageous effect of an increase in frequency is lost and when frequency exceeds 1 GHz, sufficient sensitivity is not obtained.

The present inventors have found for the first time that an optimal range of sensitivity is present at a frequency around 1 GHz in such a hardly predictable phenomenon affected by a plurality of factors.

On the other hand, consideration will be given to the reason why excellent measurement range is obtained when a high frequency electric current has a frequency in the range of 0.3 to 1.0 GHz inclusive.

It has been supposed that measurement range is not changed by increasing frequency, but in reality it is found that measurement range is widened in a considerably wide frequency range. This is now supposed to be caused by the following reason.

For example, as a high frequency electric current having a higher frequency is applied to a magnetosensitive wire, the electric current flows within a smaller skin depth of the magnetosensitive wire due to skin effect. As skin depth is smaller, internal stress is increased in the neighborhood of a surface of the magnetosensitive wire as mentioned before. It is supposed that, as internal stress is greater, anisotropy magnetic field is stronger and accordingly measurement range is widened. The reason why widening of measurement range is almost saturated at a frequency of 0.5 GHz or more is supposed to be that skin depth is very small at that frequency or more, so change in internal stress is saturated.

Advantageous Effects of Invention

The invention recited in claim 1 can simultaneously improve sensitivity and measurement range of a conventional magnetoimpedance sensor by employing a method using a detection coil for detecting an output and applying a high frequency electric current having a frequency in the range of 0.3 to 1.0 GHz inclusive, which is higher than conventional frequencies, when a magnetosensitive wire formed of an amorphous soft magnetic alloy having zero magnetostriction has at least a surface layer in which spins are aligned in a circumferential direction of the wire.

MODE FOR CARRYING OUT THE INVENTION

Examples of the present invention will be explained appropriately in comparison with conventional examples. It should be noted that the present invention is not limited to the following examples.

<Magnetosensitive Wire>

A magnetosensitive wire of the present invention comprises an amorphous soft magnetic alloy having zero magnetostriction. For example, "Jiki Sensa Rikougaku" (CORONA PUBLISHING CO., LTD.), page 13 discloses "When Fe/Co is about 0.07 in $(CoFe)_{80}(SiB)_{20}$, the absolute value of magnetostriction is less than $10^{-6}$ and this level of magnetostriction is regarded as zero magnetostriction". Zero magnetostriction in the present invention is also defined to be this level.

It is preferable that the magnetosensitive wire comprises a Co—Fe—Si—B based alloy having zero magnetostriction. Besides, the magnetosensitive wire may comprise amorphous alloys such as known amorphous Co—Mn—Si—B based alloys and Fe—Si based alloys. It is desirable that the entire magnetosensitive wire has an amorphous phase but the magnetosensitive wire may include a small amount of precipitated phase which generates uniform internal stress in the wire. Examples of precipitated phase include Fe—B, Fe—Si, Co—B, Co—Si, Co, or Fe based alloys and Si—B based compounds. Magnetosensitive wires having a surface layer in which spins are aligned in a circumferential direction can be obtained by employing the abovementioned amorphous alloys for magnetosensitive wires.

In the examples of the present invention, an amorphous wire having a composition of $Co_{71.2}Fe_{4.8}Si_{11.8}B_{12.2}$ (at %) and a diameter of 11.6 μm was employed as a specimen material (Specimen 1). This specimen material was produced by an improved Taylor method. An amorphous wire obtained by applying heat treatment to this specimen material at an atmosphere temperature of 520 deg. C. for 7 sec. while applying a tension of 200 MPa was also used as a specimen material (Specimen 2).

<<MI Element>>

Figure 1:
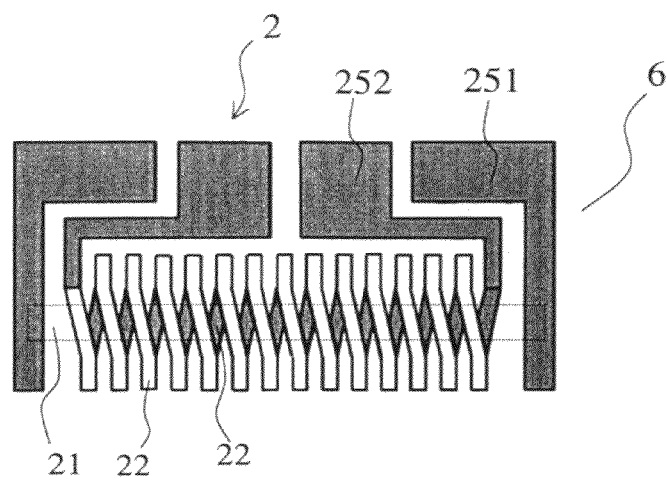
FIG. 1 is a schematic front view of an MI element of the present invention.

Constitution of an MI element 2 according to examples of the present invention will be explained with reference to the schematic view of FIG. 1.

First, a detection coil 22 is placed around a magnetosensitive wire 21 with an electric insulator 23 (not shown) disposed therebetween, and these are disposed on a substrate 6. Then, both ends of the magnetosensitive wire 21 are connected to electrodes 251 for applying a pulse current, and the detection coil 22 is connected to electrodes 252 for detecting voltage which changes corresponding to an external magnetic field. The magnetosensitive wire has a length of 0.6 mm and the detection coil 30 has 15 turns. This constitution is just an example and similar effects can be obtained in a known detection coil type MI element structure.

<<MI Sensor>>

Figure 2:
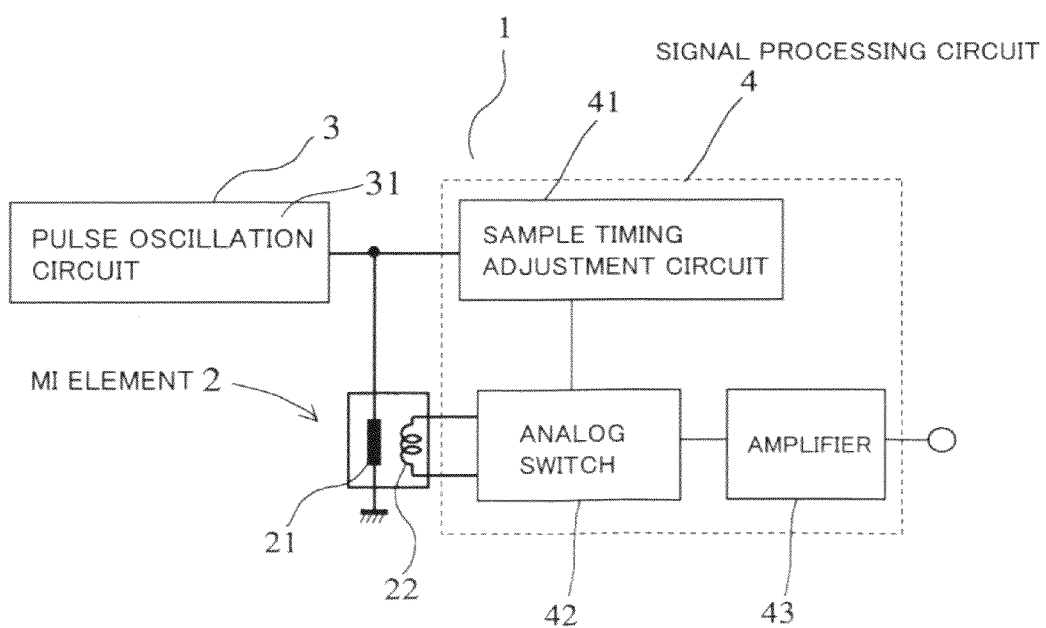
FIG. 2 is a schematic view of an electronic circuit of an MI sensor of the present invention.

An electronic circuit of an MI sensor 1 using the MI element 2 according to the examples of the present invention will be explained with reference to FIG. 2. The MI sensor 1 comprises the MI element 2, an electric current supply unit 3 and a signal processing circuit 4. A pulse oscillation circuit 31 was employed as the electric current supply unit for supplying a high frequency current in the examples of the present invention.

Operation of the sensor 1 is as follows. When a pulse current having a frequency in the range of 0.3 to 1.0 GHz inclusive, which is calculated by a later-discussed method, is generated by the pulse oscillation circuit 31 and supplied to the magnetosensitive wire 21 in the MI element 2, voltage corresponding to an external magnetic field is generated based on rotation of spins caused by an action between an external magnetic field and a magnetic field in a wire circumferential direction formed by the pulse current.

Figure 3:
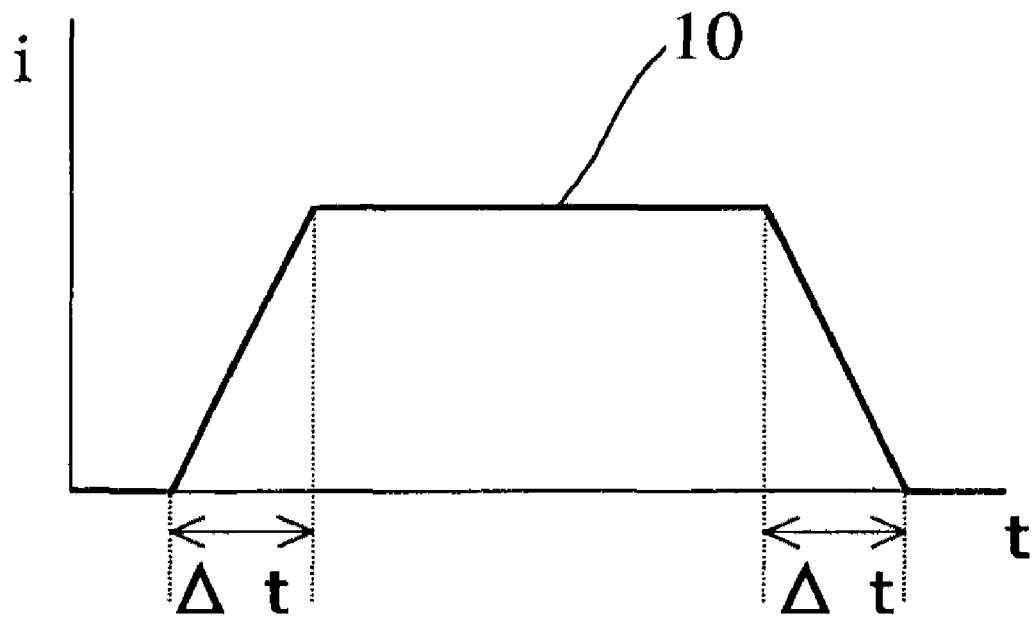
FIG. 3 are diagrams for explaining a method for calculating frequency from rise time or fall time of a pulse current used in an MI element and an MI sensor of the present invention.
Figure 3:
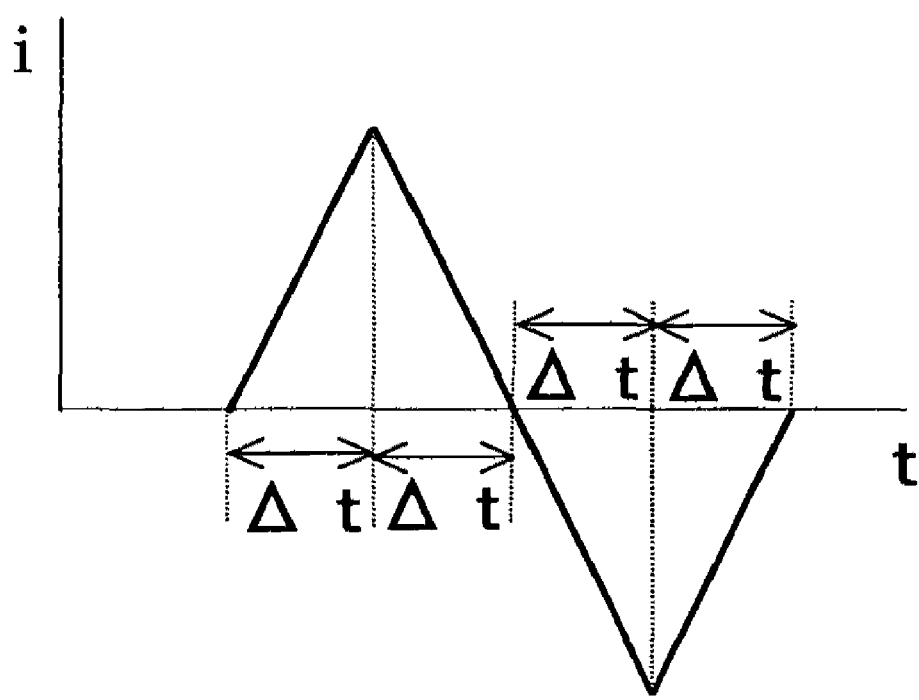

The frequency here is calculated by measuring rise time or fall time Δt of a pulse of a pulse current waveform 10 as shown in FIG. 3(a) and assuming that the time Δt is equal to one fourth of one cycle time as shown in FIG. 3(b). Next, after the pulse current has risen, an analog switch 42 is turned on and off in a short time at a predetermined timing by a sample timing adjustment circuit 41. Thus, the analog switch 42 samples a voltage generated at the detection coil 22 and corresponding to an external magnetic field and outputs the voltage to an amplifier 43. When a pulse current is cut off (i.e., falls) a similar processing can be carried out. This constitution is just an example and similar effects can be obtained in an electronic circuit of a known type of MI sensor which detects a magnetic change in a magnetosensitive wire with a detection coil.

Figure 4:
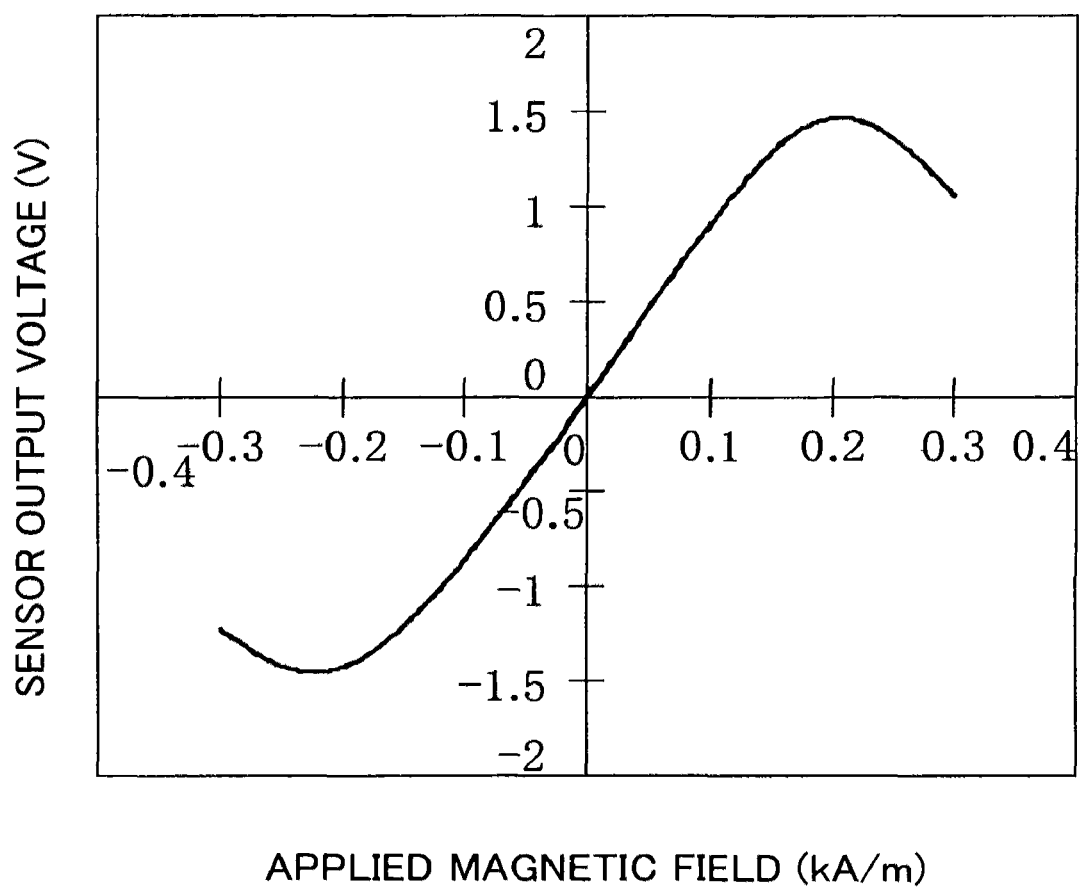
FIG. 4 is a graph showing a relation between sensor output and applied magnetic field in an MI sensor according to an example of the present invention.

Methods for measuring MI characteristics and methods for calculating sensitivity and measurement range in the examples of the present invention will be described. The amorphous wire of Specimen 1 was assembled in an MI sensor and the MI sensor was placed in a magnetic field of ±0.3 kA/m in maximum, 10 Hz, and a pulse current of 80 mA corresponding to a frequency of 0.3 GHz was input to the magnetosensitive wire. Voltage signals generated at the detection coil were processed by the abovementioned sensor. Measurement results of the output voltage are shown in FIG. 4. It should be noted that voltage was detected at a rise portion of a pulse but can be detected at a fall portion of a pulse and can be detected both at a rise portion and a fall portion of a pulse. Measurement range was defined as a magnetic field range where linearity is not more than 1% F. S. around zero magnetic field. It should be noted that linearity was evaluated by the evaluation method No. 2623 of JIS B 0155. Sensitivity was defined as slope of output voltage within the measurement range.

Figure 5:
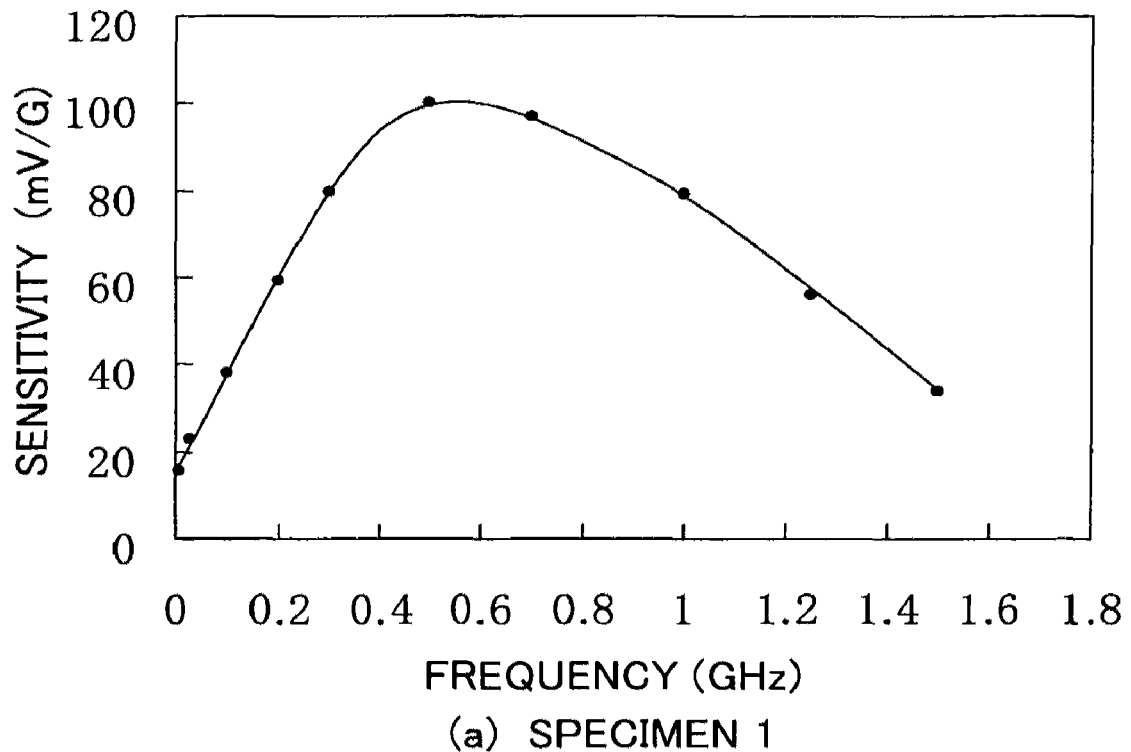
FIG. 5 are graphs showing relation between sensor sensitivity and frequency in MI sensors according to examples of the present invention.
Figure 5:
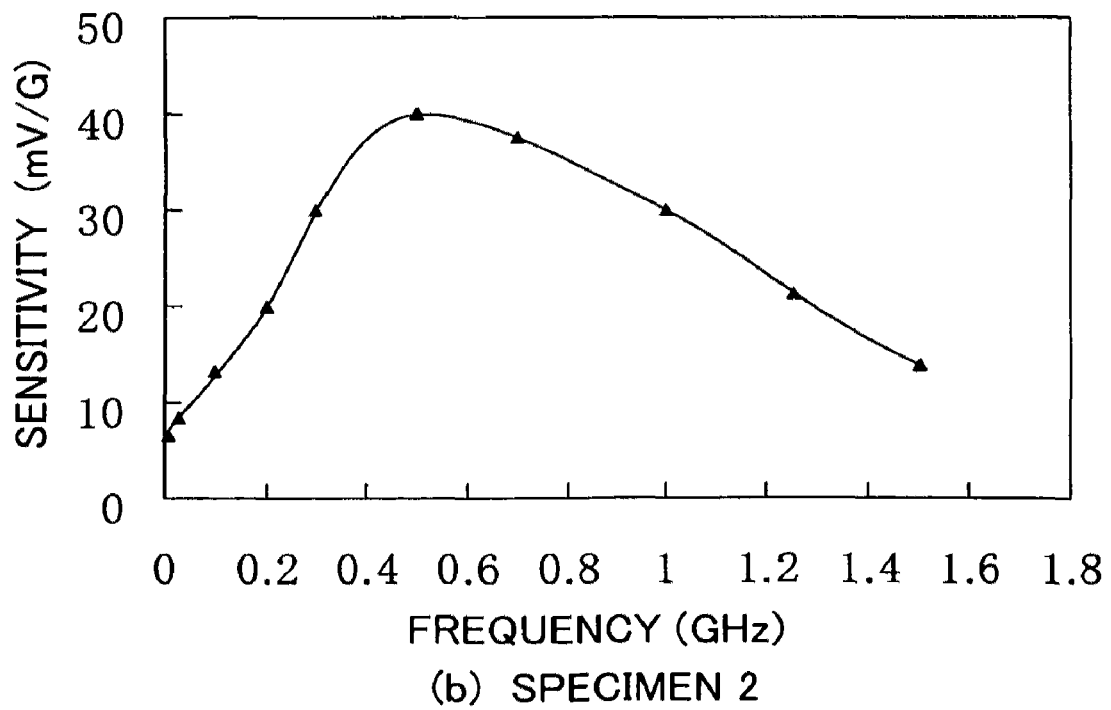

Next, Specimens 1, 2 were respectively assembled in MI sensors and respective sensors were placed in a magnetic field of ±12 kA/m in maximum, 10 Hz, and pulse currents of 80 mA corresponding to frequencies of 0.3, 0.5, 0.7, 1.0 GHz were input to the magnetosensitive wires and similar measurement were carried out. As comparative examples, measurement was also conducted by changing frequency to 0.01, 0.03, 0.1, 0.2, 1.25, 1.5 GHz. Based on the measurement results, relation between sensitivity and frequency in the MI sensors of the present invention is shown in FIG. 5. FIG. 5(a) shows measurement results using Specimen 1 and FIG. 5(b) shows those using Specimen 2. As shown in FIG. 5(a), when Specimen 1 just as produced by the improved Taylor method was employed, sensitivity greatly increased to 1.3 to 1.7 times in a frequency range of 0.3 to 1.0 GHz when compared to sensitivity at a conventional frequency of 0.2 GHz. As shown in FIG. 5(b), when Specimen 2 produced by tension annealing Specimen 1 under predetermined conditions was employed, sensitivity greatly improved to 1.5 to 2.0 times in a frequency range of 0.3 to 1.0 GHz when compared to sensitivity at a conventional frequency of 0.2 GHz. These results demonstrate that in the present invention at least 1.3 times of sensitivity can be obtained when compared to sensitivity of an MI sensor driven at a conventional frequency of 0.2 GHz. In order to obtain higher sensitivity, it is preferable that frequency is in the range of 0.4 to 0.75 GHz, 0.4 to 0.7 GHz, 0.45 to 0.65 GHz, or 0.45 to 0.58 GHz inclusive.

Figure 6:
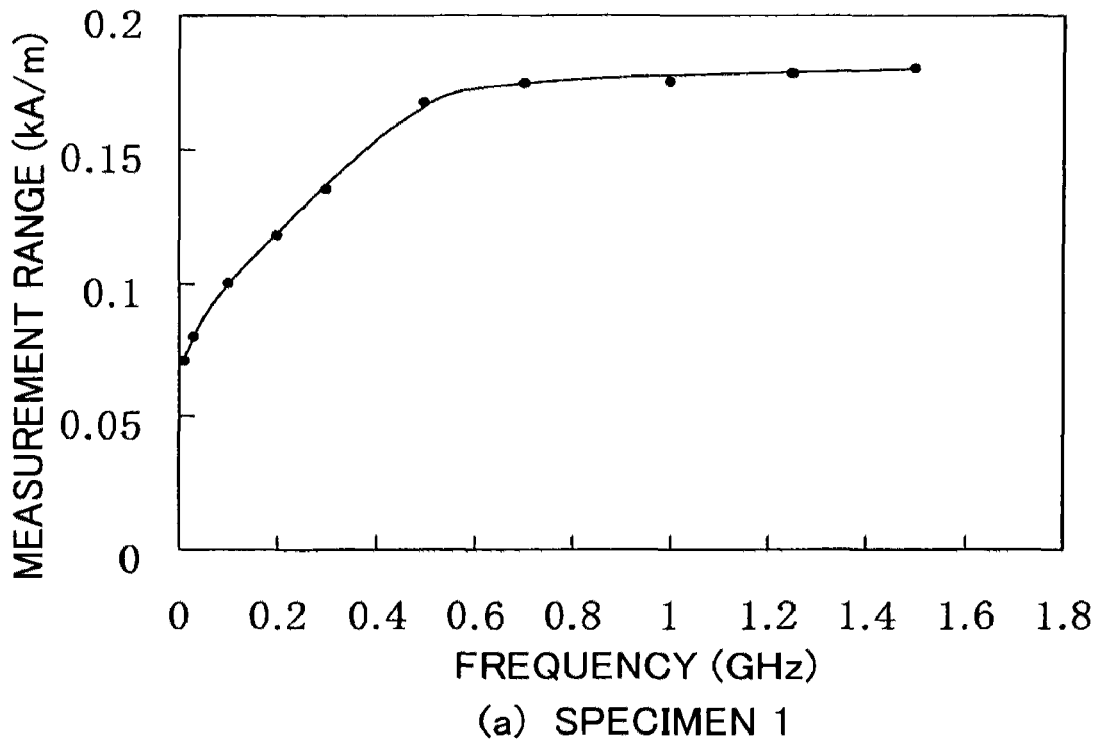
FIG. 6 are graphs showing relation between measurement range and frequency in MI sensors according to the examples of the present invention.
Figure 6:
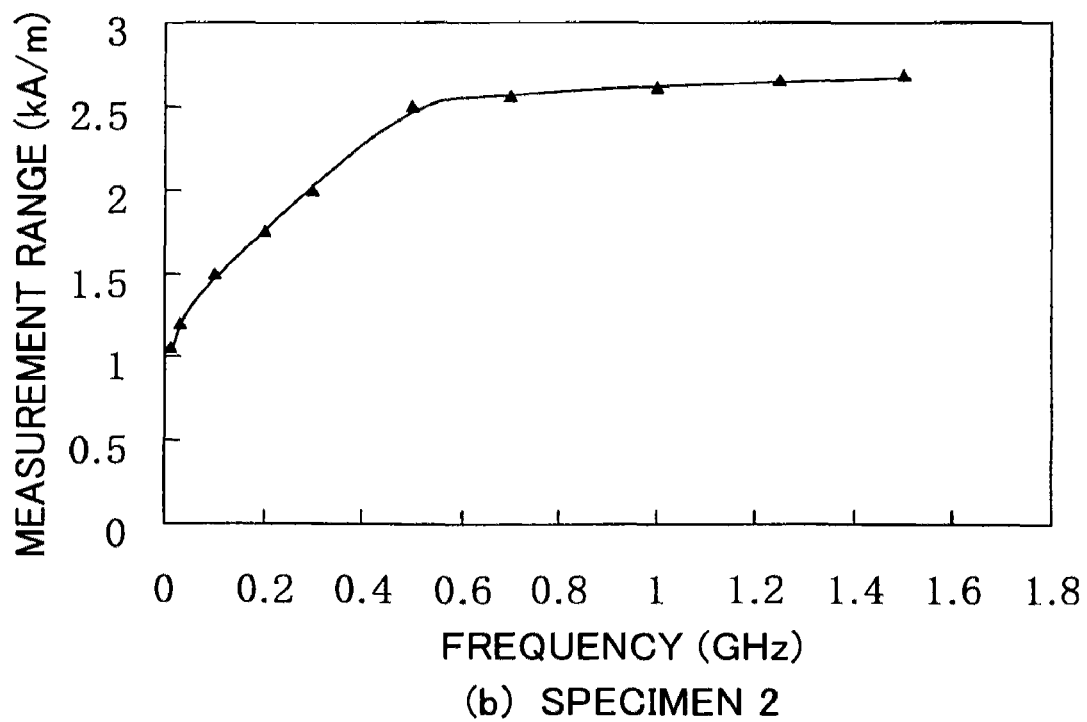

On the other hand, the relation between measurement range and frequency in the MI sensors of the present invention is shown in FIG. 6. FIG. 6(a) shows measurement results using Specimen 1, and FIG. 6(b) shows those using Specimen 2. As shown in FIG. 6(a), when Specimen 1 just as produced by the improved Taylor method was employed, measurement range greatly increased to 1.1 to 1.5 times in a frequency range of 0.3 to 1.0 GHz when compared to measurement range at a conventional frequency of 0.2 GHz. As shown in FIG. 6(b), when Specimen produced by tension annealing Specimen 1 under predetermined conditions was employed, measurement range greatly increased to 1.1 to 1.5 times in a frequency range of 0.3 to 1.0 GHz when compared to measurement range at a conventional frequency of 0.2 GHz. These results demonstrate that in the present invention at least 1.1 times of measurement range can be obtained when compared to measurement range of the MI sensors driven at a conventional frequency of 0.2 GHz. In order to obtain a wider measurement range, it is preferable that frequency is in the range of 0.4 to 1 GHz, 0.45 to 1 GHz, or 0.50 to 1 GHz inclusive.

It is apparent from the results of FIG. 5 and FIG. 6 that higher sensitivity and wider measurement range can be simultaneously obtained by the present invention in both cases where a magnetosensitive wire just as produced by the improved Taylor method and a magnetosensitive wire produced by tension annealing such a wire are employed.

In order to simultaneously attain both high sensitivity and wide measurement range at higher levels, it is preferable that frequency is in the range of 0.4 to 0.75 GHz, 0.4 to 0.7 GHz, 0.45 to 0.65 GHz, or 0.45 to 0.58 GHz inclusive.

| REFERENCE SIGNS LIST | |
|---|---|
| 1: | an MI sensor |
| 2: | an MI element |
| 21: | a magnetosensitive wire |
| 22: | a detection coil |
| 23: | an electric insulator |
| 251: | terminals for a magnetosensitive wire |
| 252: | terminals for a detection coil |

| REFERENCE SIGNS LIST (-continued) | |
|---|---|
| 3: | an electric current supply unit |
| 31: | a pulse oscillation circuit |
| 4: | a signal processing circuit |
| 41: | a sample timing adjustment circuit |
| 42: | an analog switch |
| 43: | an amplifier |
| 6: | a substrate |
| 10: | a pulse current waveform |

The invention claimed is:

1. A magnetoimpedance sensor, comprising:
a magnetoimpedance element including a magnetosensitive wire formed of an amorphous soft magnetic alloy having zero magnetostriction, and a detection coil provided around the magnetosensitive wire with an electric insulator disposed therebetween, thereby detecting voltage generated at the detection coil and corresponding to an external magnetic field upon application of a high frequency electric current to the magnetosensitive wire;
an electric current supply unit for supplying the high frequency electric current to the magnetoimpedance element; and
a signal processing circuit for signal processing an output from the detection coil, wherein
the magnetosensitive wire has at least a surface layer in which spins are aligned in a circumferential direction of the wire, and
the high frequency electric current has a frequency in the range of 0.3 to 1.0 GHz inclusive.

* * * * *